(12) United States Patent
Knapp et al.

(10) Patent No.: US 7,227,240 B2
(45) Date of Patent: Jun. 5, 2007

(54) SEMICONDUCTOR DEVICE WITH WIRE BOND INDUCTOR AND METHOD

(75) Inventors: James Knapp, Gilbert, AZ (US);
Francis Carney, Gilbert, AZ (US);
Harold Anderson, Chandler, AZ (US);
Yenting Wen, Chandler, AZ (US);
Cang Ngo, Mesa, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/524,894

(22) PCT Filed: Sep. 10, 2002

(86) PCT No.: PCT/US02/28883

§ 371 (c)(1),
(2), (4) Date: Sep. 7, 2005

(87) PCT Pub. No.: WO2004/025695

PCT Pub. Date: Mar. 25, 2004

(65) Prior Publication Data

US 2005/0285262 A1    Dec. 29, 2005

(51) Int. Cl.
*H01L 23/52*    (2006.01)
*H01L 23/64*    (2006.01)
*H01L 23/48*    (2006.01)
*H01L 23/58*    (2006.01)
*H01F 17/00*    (2006.01)

(52) U.S. Cl. .............................. 257/531; 257/E23.043; 257/E23.079; 257/E23.077; 257/E23.114; 257/E27.046; 257/E23.062; 257/E23.075; 257/E23.035; 257/E23.031; 257/E23.024; 257/E29.198; 257/528; 257/723; 257/724; 257/725; 257/728; 257/535; 257/784; 257/786; 257/685; 257/698; 361/793; 361/782; 361/763; 439/55; 174/260; 174/256; 372/38.02; 372/38.1

(58) Field of Classification Search ........ 257/E23.043, 257/E23.079, E23.114, E27.046, E23.062, 257/E23.075, E23.033, E23.031, E23.024, 257/E29.198, 531, 528, 535, 516, 728, 723–725, 257/685, 532, 784, 86, 690–693, 696, 698, 257/666, 676
See application file for complete search history.

(56) References Cited

U.S. PATENT DOCUMENTS 6,310,393 B1 * 10/2001 Ogura et al. ............... 257/723
6,512,285 B1 *  1/2003 Hashemi et al. ........... 257/531

(Continued)

FOREIGN PATENT DOCUMENTS

EP    1 202 296 A1 *  5/2002

(Continued)

*Primary Examiner*—Alexander Oscar Williams
(74) *Attorney, Agent, or Firm*—James J. Stipanuk; Kevin B. Jackson

(57) ABSTRACT

A semiconductor device (10) includes a semiconductor die (20) and an inductor (30, 50) formed with a bonding wire (80) attached to a top surface (21) of the semiconductor die. The bonding wire is extended laterally a distance (L30, L150) greater than its height (H30, H50) to define an insulating core (31, 57). In one embodiment, the inductor is extended beyond an edge (35, 39) of the semiconductor die to reduce loading.

18 Claims, 7 Drawing Sheets

U.S. PATENT DOCUMENTS

| | | | |
|---|---|---|---|
| 6,775,901 B1 * | 8/2004 | Lee et al. | 29/602.1 |
| 6,803,665 B1 * | 10/2004 | Megahed et al. | 257/780 |
| 2002/0118523 A1 * | 8/2002 | Okabe et al. | 361/793 |

FOREIGN PATENT DOCUMENTS

| | | | |
|---|---|---|---|
| EP | 1202296 A1 * | 5/2002 | |
| JP | 6-140451 * | 5/1994 | |
| JP | 10-289921 * | 10/1998 | |
| WO | WO 00/10179 * | 2/2000 | |
| WO | 2004/025695 A2 * | 3/2004 | |

\* cited by examiner

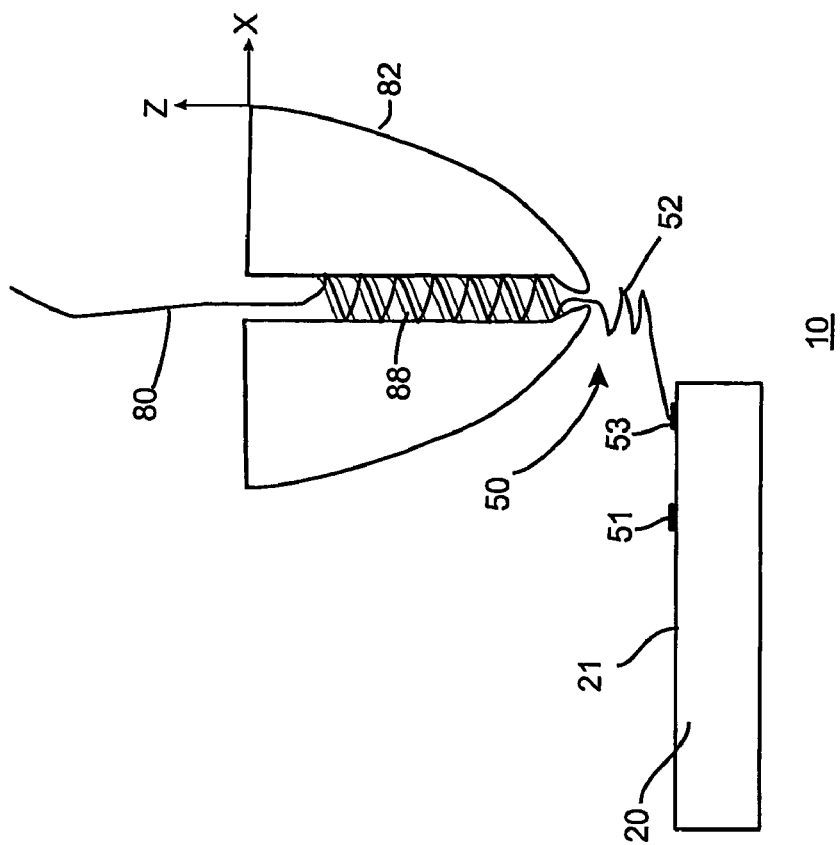
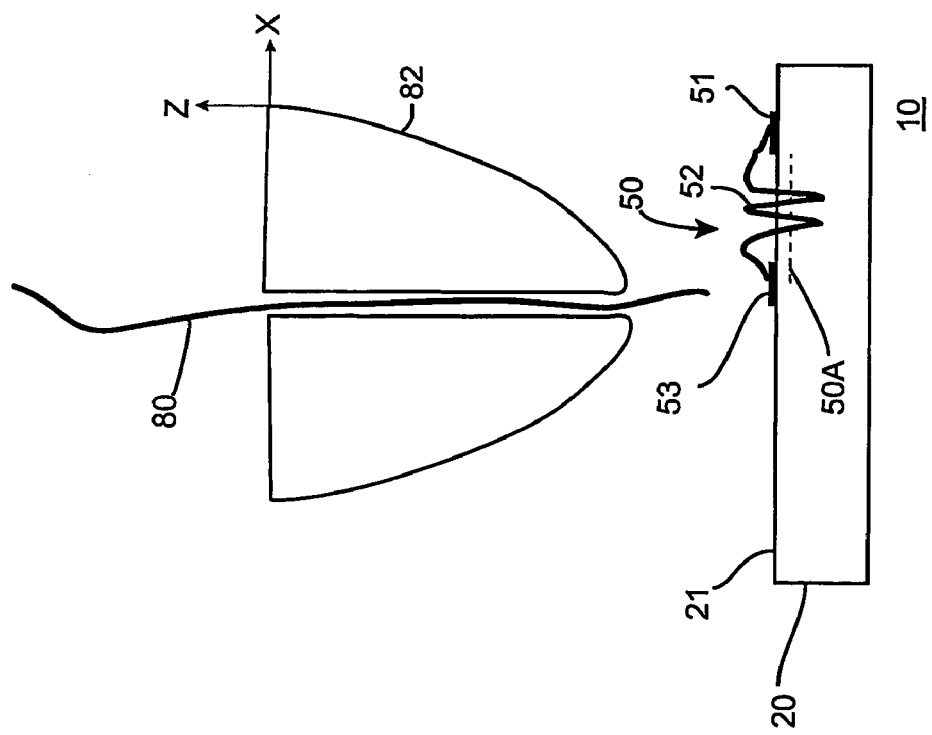
FIG. 6
FIG. 5B

SEMICONDUCTOR DEVICE WITH WIRE BOND INDUCTOR AND METHOD

BACKGROUND OF THE INVENTION

The present invention relates in general to semiconductor devices and, more particularly, to integrated circuits that are formed with a semiconductor die and inductors housed in the same semiconductor package.

Electronic system manufacturers continue to demand integrated circuits with increased levels of functionality and a physically smaller size. The demand is particularly evident with portable wireless communications devices, whose size typically is limited by hundreds of discrete passive components that have not yet been successfully integrated due to their operation at frequencies of 2.5 gigahertz or more. High frequency inductors have proven to be particularly difficult to integrate on a semiconductor die because of the performance degradation resulting from the parasitic substrate capacitance and eddy currents.

One previous approach to integrating inductors has been to form planar spiral inductors and their associated circuitry on the same semiconductor die. However, the quality factor of the planar spiral inductors is low due in part to the parasitic substrate capacitance and eddy currents mentioned above. In addition, the additional processing steps and large die area occupied by the planar inductors has a high cost that has made this approach uneconomical in many applications.

Another approach has been to house a discrete chip inductor and a semiconductor die into the same integrated circuit package. The chip inductors have a high quality factor but the component placement and solder reflow processing step needed to mount the inductor also result in a high overall fabrication cost. Moreover, existing discrete chip inductors have a large physical size that increases the profile of the packaged integrated circuit and precludes their use in many applications.

Hence, there is a need for an integrated circuit and method-of integrating inductors that combines a low fabrication cost, small physical size and high performance.

BRIEF DESCRIPTION OF THE DRAWINGS

FIG. 5B is a side view of the semiconductor device after a third fabrication stage; and FIG. 6 is a side view of the semiconductor device showing an alternate method of fabrication.

DETAILED DESCRIPTION OF THE DRAWINGS

In the figures, elements having the same reference number have similar functionality.

Figure 1:
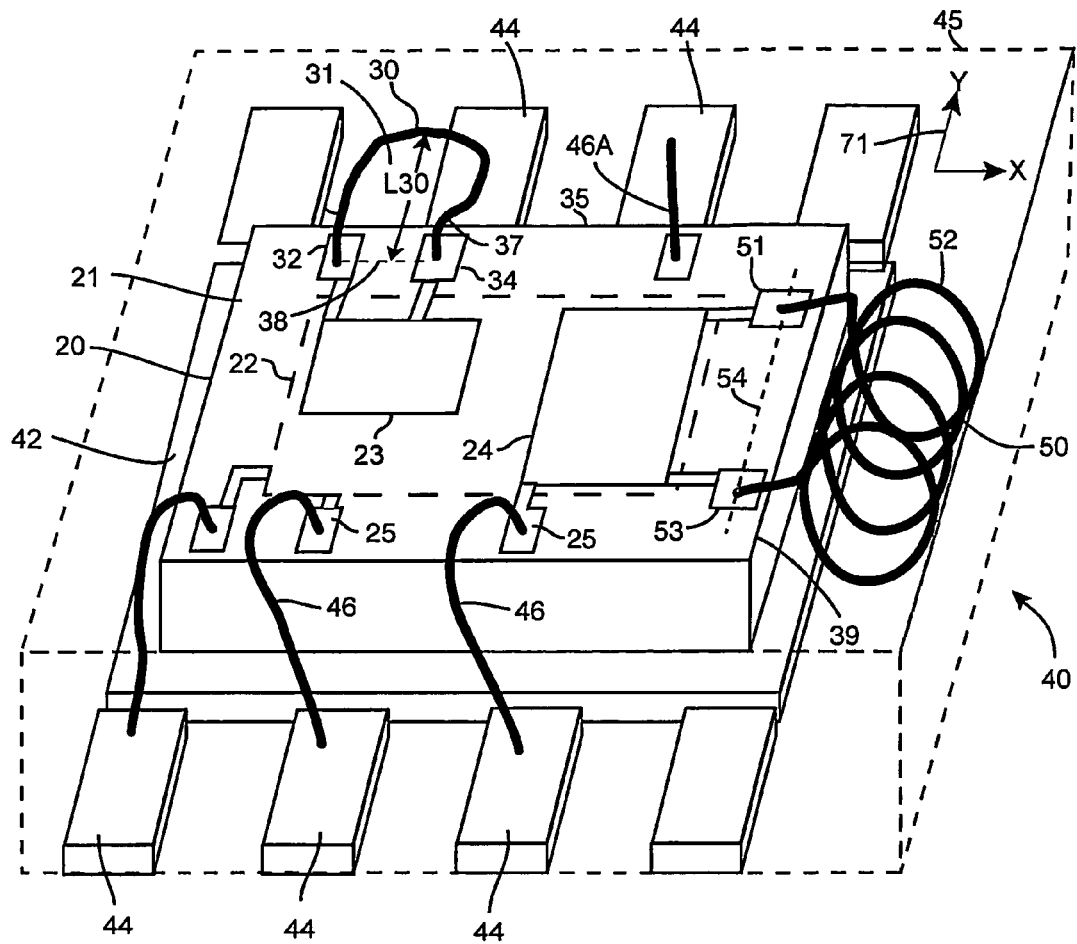
FIG. 1 is an isometric view of a semiconductor device housed in a semiconductor package with inductors.

FIG. 1 is an isometric view of a semiconductor device configured as an integrated circuit (IC) 10 that includes a semiconductor die 20 and wire bond inductors 30 and 50 all housed in a semiconductor package 40. In one embodiment, integrated circuit 10 functions as a high frequency oscillator for use in a dual-band wireless communications device (not shown). Accordingly, integrated circuit 10 generates a high frequency signal operating at either about eight hundred megahertz or about 2.4 gigahertz.

Semiconductor package 40 includes a die attach flag 42 for mounting semiconductor die 20. A plurality of leads 44 provide electrical connections to external circuitry (not shown). A plurality of wire bonds 46 and a wire bond 46A are attached between leads 44 and a plurality of bonding pads 25 to route signals between the external circuitry and semiconductor die 20. Package 40 includes a molded encapsulant 45 for protecting integrated circuit 10 from damage and corrosion.

Semiconductor die 20 is a monocrystalline silicon chip with a top surface 21 formed with a voltage controlled oscillator (VCO) 22 having a pair of voltage variable capacitors 23 and 24. Capacitor 23 and inductor 30 are connected in parallel to operate as a first tank circuit for setting the 2.4 gigahertz operating frequency of VCO 22, while capacitor 24 and inductor 50 are connected in parallel to operate as a second tank circuit that establishes the eight hundred megahertz operating frequency.

Wire bonds 46 and 46A are standard wire bonds formed between their respective attachment points or points of contact between bonding pads 25 and leads 44. Each of the wire bonds 46 and 46A are formed using a wire bonding tool that attaches or welds the bonding wire to a first attachment point on one of the bonding pads 25. The bonding wire is then fed through a capillary that moves to a second attachment point on one of the leads 44. The wire bonding tool is programmed to locate the first and second attachment points and loop the bonding wire to an optimal height determined by the physical characteristics of a semiconductor die, package and bonding wire.

In order to make wire bonds on a wide variety of semiconductor packages, wire bond tools have mechanisms capable of three-axis motion, i.e., X- and Y-axis motion as indicated by a reference plane 71 coplanar with top surface 21, and Z-axis motion perpendicular to plane 71. Modern wire bonding tools are programmed to locate the attachment points and to bond the wire in a point to point fashion. However, in order to form robust and reliable wire bonds in devices with high pin counts, as well as minimizing wire bond inductance, wire bond tools are programmed with control software that prevents standard wire bonds from deviating laterally in an X- or Y-direction from a line between the attachment points. Standard wire bonds are formed with only a vertical or Z-axis deviation to set the desired the loop height. Consequently, either a top view or a view along the length of a standard wire bond appears as a straight line. For example, if a standard wire bond's attachment points lie along the X-axis, all of its points will have a Y-value of substantially zero and a top view will appear as a straight line lying along the X-axis. This can be seen with wire bond 46A, which appears as a straight line because its attachment points are in a line with the view point of FIG. 1.

Inductor 30 is formed with a bonding wire typically having a circular cross-section and which is attached in a standard fashion to bonding pads 32 and 34. In contrast with wire bonds 46 and 46A, inductor 30 is formed to extend laterally a distance L30 from a line 38 through its points of attachment to bonding pads 32 and 34. This lateral projection achieves a higher value of inductance than a standard wire bond without increasing the physical height of integrated circuit 10. The bonding wire used to form inductor 30 preferably comprises a low resistance metal suitable for wire bonding such as gold or copper, although aluminum or other metals or alloys may be used as well. In one embodiment, inductor 30 is formed with a bonding wire made of gold and having a diameter of about fifty micrometers. Inductor 30 typically has an inductance value in a range between about 0.5 and 3.0 nanohenries.

Inductor 50 is formed with wirebond wire typically of circular cross-section. Inductor 50 similarly is attached to bonding pads 51 and 53 and is formed with a coil 52 around an inductor core 57. To reduce the fabrication cost of integrated circuit 10, inductor 50 typically is formed with a bonding wire of similar composition as inductor 30. However, in a suitable application, the inductor 50 bonding wire may have a different diameter or a different material composition. Inductor 50 typically has an inductance value greater than about two nanohenries. For inductance values of fifteen or more nanohenries, it may be advantageous to use an insulated bonding wire to avoid shorts when forming a large number of closely wound turns.

Inductors 30 and 50 are formed with a wire bond tool whose control software is modified to take advantage of the inherent X-, Y- and Z-axis motion of the tools mechanism. In the embodiment shown in FIG. 1, the lateral or XY deviation capability results in extending inductor 30 laterally past edge 35 of semiconductor die 20. A similar result is obtained for inductor 50, which uses a lateral displacement to form coil 52 as well as to extend it past edge 39.

Figure 1A:
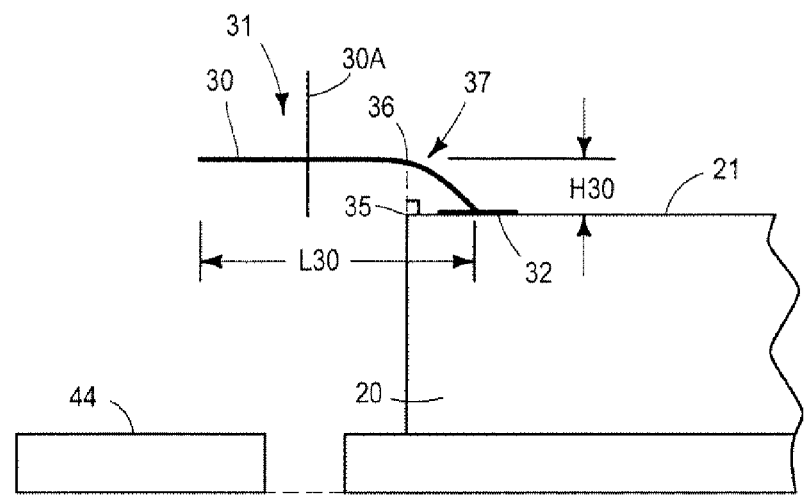
FIG. 1A is a side view of a first portion of the semiconductor device.

FIG. 1A is a side view of a portion of integrated circuit 10 in the embodiment of FIG. 1 showing inductor 30 in further detail. It can be seen that inductor 30 is formed to project laterally over edge 35 in a fashion similar to a cantilever in order to provide a high inductance and quality factor and a low package profile. Inductor 30 is self-supporting when formed with standard bonding wire material but, if needed in a particular application, the material used to form inductor 30 may be alloyed or doped with beryllium or other material in order to increase rigidity and provide a springlike resilience or metal "memory" that maintains its shape and position both during and after bonding.

Because inductor 30 extends laterally over edge 35, it has two locations 36 and 37 that lie directly or vertically over edge 35. Inductor 30 is shaped to define an inductor core 31 centered along an axis 30A substantially perpendicular to top surface 21 to enclose a magnetic flux when current flows through inductor 30. To achieve a high quality factor, core 31 is formed as an insulating core, which is a natural result of its fabrication since encapsulant 45 is made with an insulating molding compound such as a thermoplastic resin or epoxy. A dielectric or insulating core is one with no conductive material lying within. Before curing, the encapsulating material has a low viscosity, so inductor 30 is virtually undisturbed when encapsulating material is introduced into the package mold. After curing, the encapsulating material hardens to secure the position and shape of inductor 30. In an embodiment in which integrated circuit 10 is not encapsulated, air provides an excellent alternate insulating core material.

In order to minimize the loading effects of conductive regions of semiconductor die 20, inductor 30 is formed so that its lateral distance L30 is greater than its height H30 above top surface 21. In one embodiment, distance L30 is about six hundred micrometers while height H30 is about two hundred micrometers. Axis 30A typically is formed at a distance from line 38 of about L30/2. For a given inductance value, this arrangement ensures that axis 30A is sufficiently far from semiconductor die 20 so that little or no parasitic eddy currents flow in semiconductor die 20 that reduce the quality factor. Moreover, the separation of axis 30A from semiconductor die 20 minimizes parasitic capacitance and results in a high frequency response.

Figure 1B:
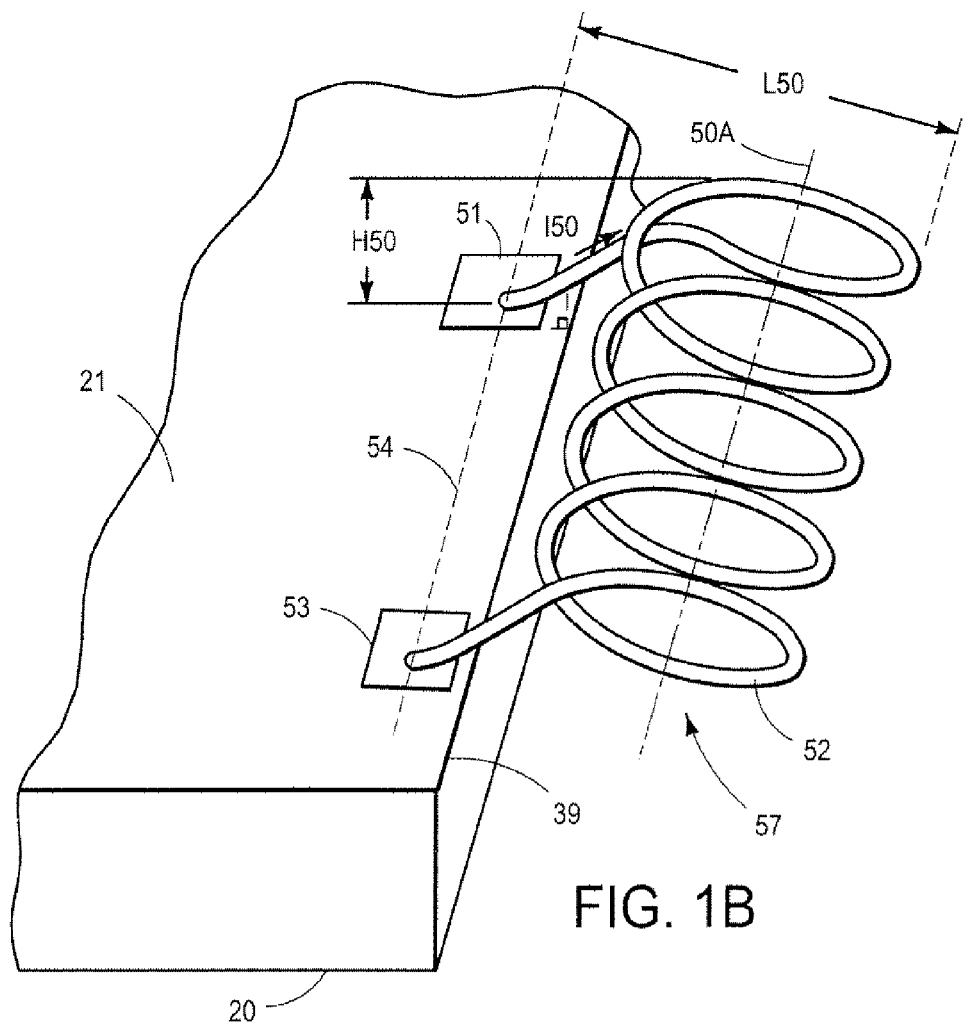
FIG. 1B is an isometric view of a second portion of the semiconductor device.

FIG. 1B is an isometric view showing details of a portion of integrated circuit 10 and inductor 50. As indicated above, inductor 50 is formed with coil 52 in order to increase its inductance while maintaining a high quality factor and a low package profile. Coil 52 typically has a cylindrical contour, but may also have an elliptical or polygonal shape as well, depending on the fabrication method. Note that in this embodiment, inductor 50 is extended laterally from a line 54 through its attachment points on bonding pads 51 and 53. Inductor 50 is self-supporting, but in some applications its bonding wire material may be alloyed or doped with beryllium or other material to increase rigidity to maintain its shape and position.

As with inductor 30, coil 52 surrounds a dielectric or insulating inductor core 57 that is substantially centered along an axis 50A running parallel to edge 39 and has a composition similar to that of core 31. A current $I_{50}$ through coil 52 develops a magnetic flux in core 57 that is centered on axis 50A. Core 57 is an insulating core that typically comprises either air or encapsulating material, as the case may be.

A low package profile is achieved by forming inductor 50 so that lateral distance L50 is greater than height H50 of the constituent bonding wire above top surface 21. Hence, core 57 is far enough from conductive regions of semiconductor die 20 so that few parasitic effects degrade the inductor 50 performance. In one embodiment, distance L50 is about six hundred micrometers while height H50 is about two hundred micrometers. Axis 50A typically is formed parallel to line 54 at a distance of about three hundred micrometers.

Figure 2:
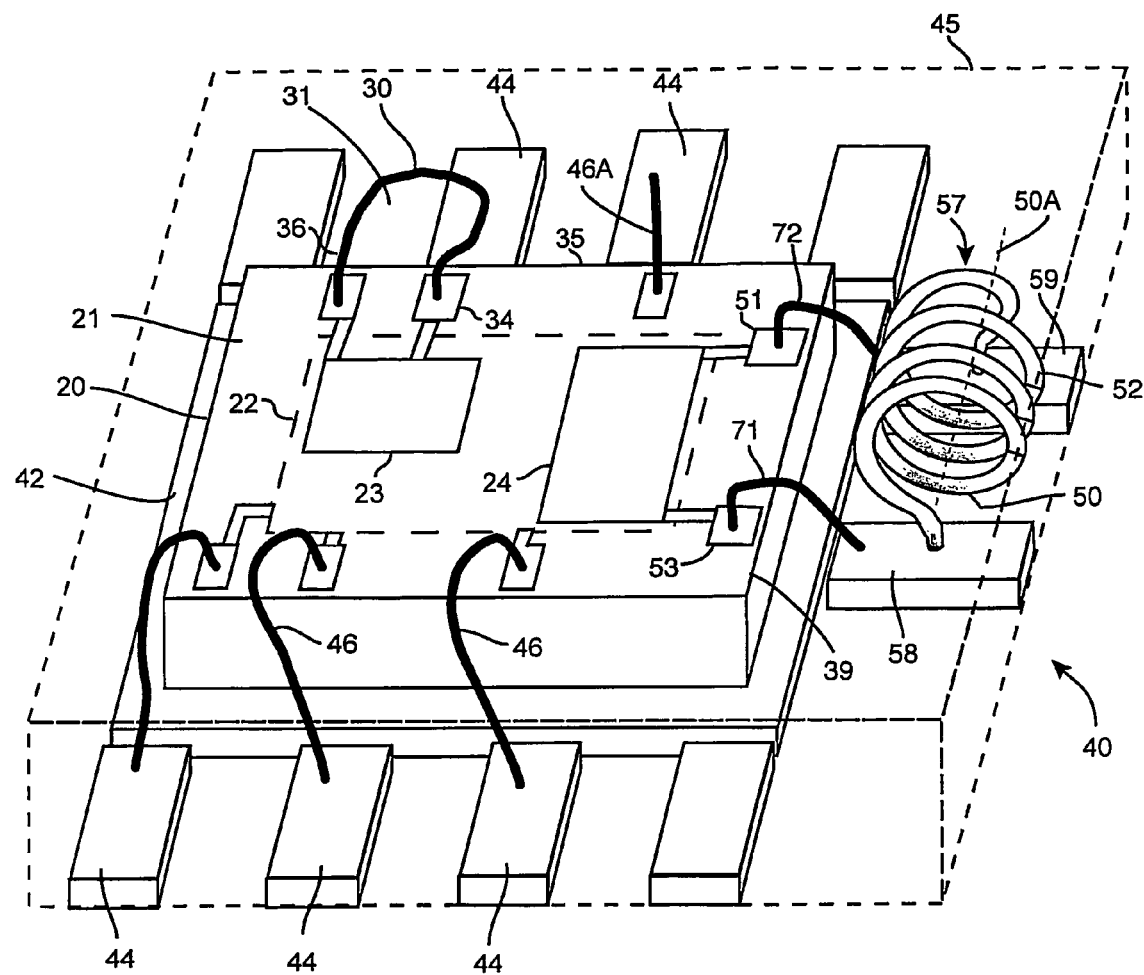
FIG. 2 is an isometric view of the semiconductor device in a first alternate embodiment.

FIG. 2 is an isometric view of integrated circuit 10 in an alternate embodiment. This embodiment has similar elements and functionality except that bonding wire inductor 50 is attached across leads 58 and 59. Inductor 50 is electrically coupled to VCO 22 through a pair of bonding wires 71-72 attached between leads 58-59 and bonding pads 51 and 53, respectively. Such lead attachment achieves a low package profile, and the additional space between inductor 50 and semiconductor die 20 may facilitate manufacture with some wire bonding tools. Note that the total inductance coupled across capacitor 24 includes the inductance of inductor 50 and the respective inductances contributed by bonding wires 71 and 72.

Figure 3:
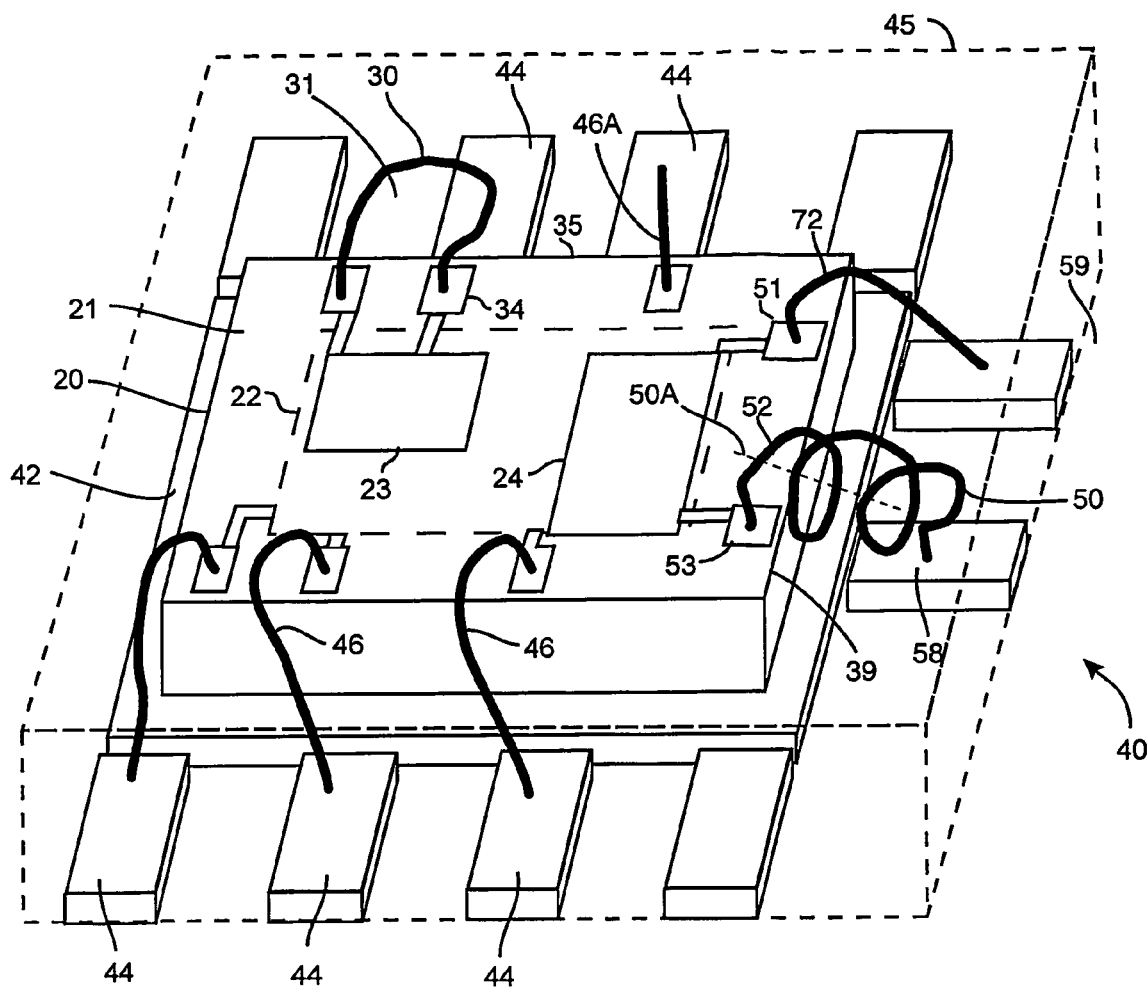
FIG. 3 is an isometric view of the semiconductor device in a second alternate embodiment.

FIG. 3 shows an isometric view of integrated circuit 10 in a second alternate embodiment where bonding wire inductor 50 is attached between bonding pad 53 and lead 58.

Figure 4:
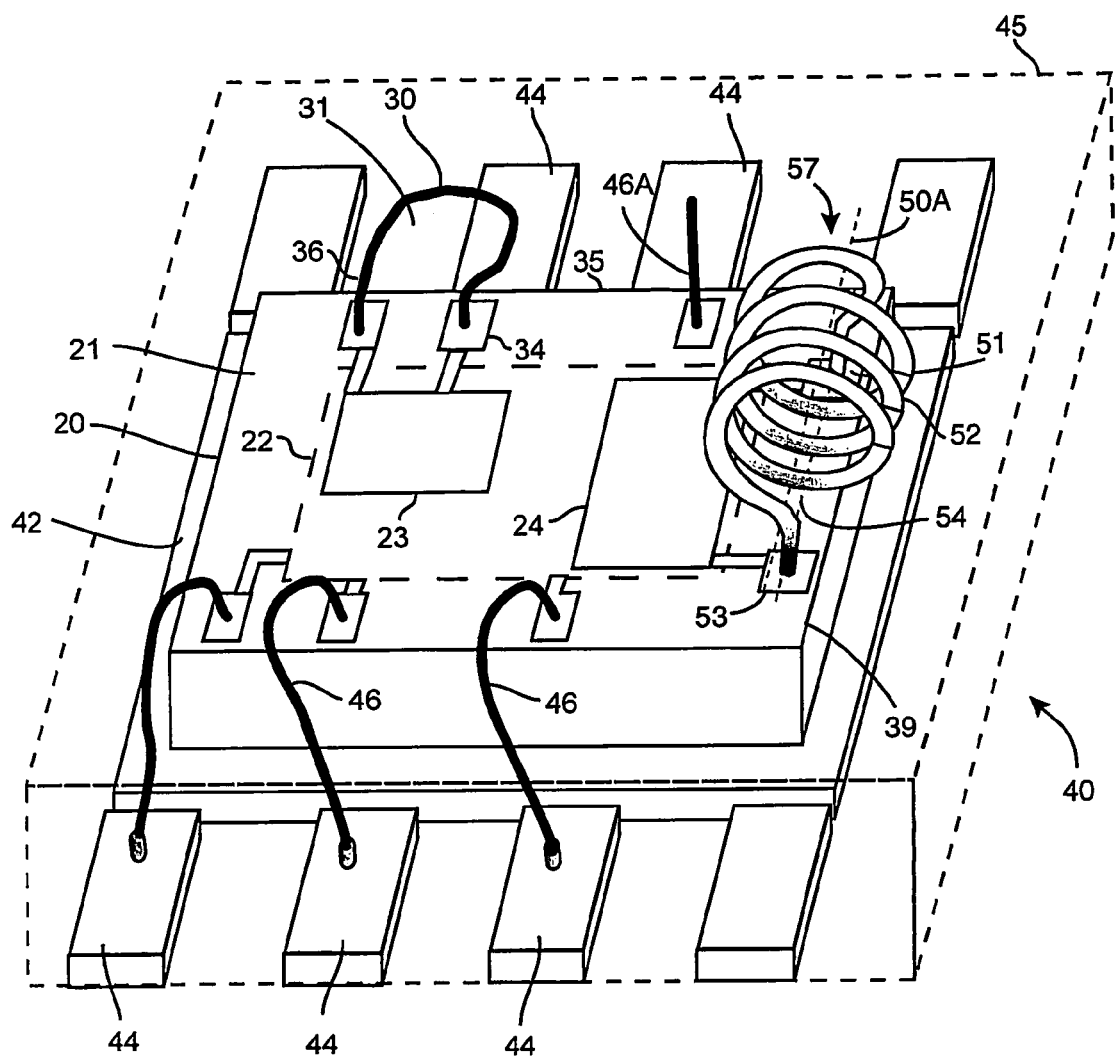
FIG. 4 is an isometric view of the semiconductor device in a third alternate embodiment.

FIG. 4 is an isometric view of integrated circuit 10 in a third alternate embodiment showing bonding wire inductor 50 with axis 50A located directly over line 54 intersecting the attachment points. In this embodiment, semiconductor package 40 has a higher profile, but the fabrication of this embodiment of inductor 50 may be easier in particular package configurations.

Figure 5:
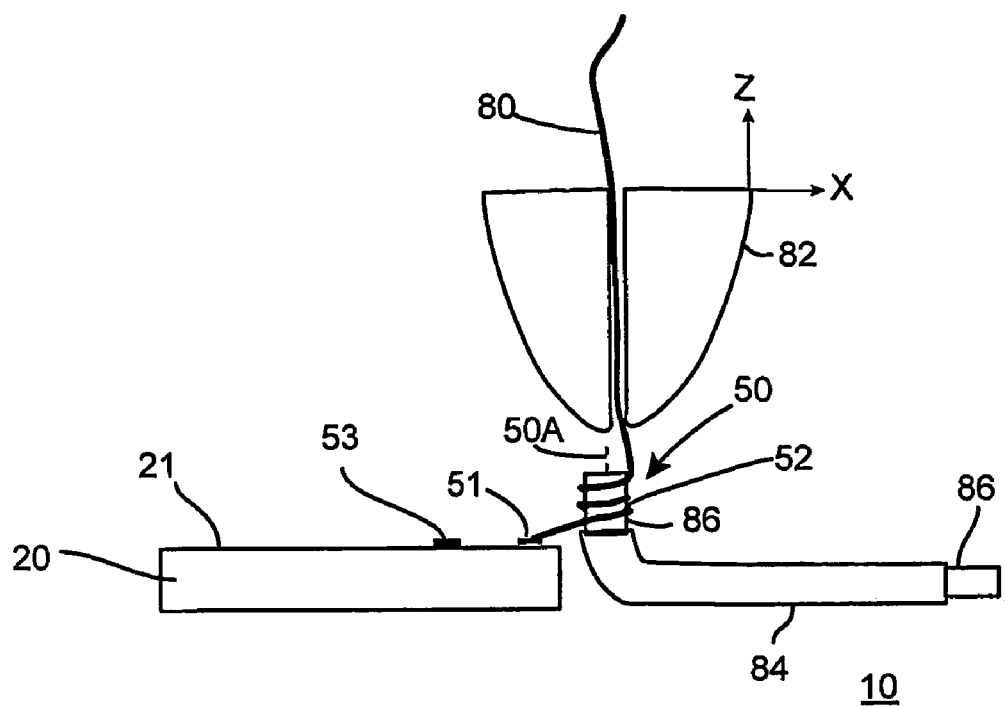
FIG. 5 is a side view of the semiconductor device after a first fabrication stage.

FIG. 5 shows a side view of integrated circuit 10 during a first stage in the fabrication of inductor 50. A bonding wire 80 is fed through a capillary 82 of a wire bonding tool. A shaper 86 is fed through a conduit or tube 80 and positioned adjacent to semiconductor die 20 as shown. In one embodiment, shaper 86 and tube 80 are made of a low friction material such as Teflon®.

Capillary 82 is programmed to first attach wire 80 to bonding pad 51 and then feed wire 80 at a shallow angle toward shaper 86, which is in its extended position in tube 84. Capillary 82 then travels in a circular XY motion while moving more slowly in a Z-direction to wind bonding wire around shaper 86 one or more times to form coil 52. The number of turns or windings is determined by the desired inductance of inductor 50. Note that coil 52 is wound in a vertical or Z-direction with axis 50A centered in shaper 86.

Figure 5A:
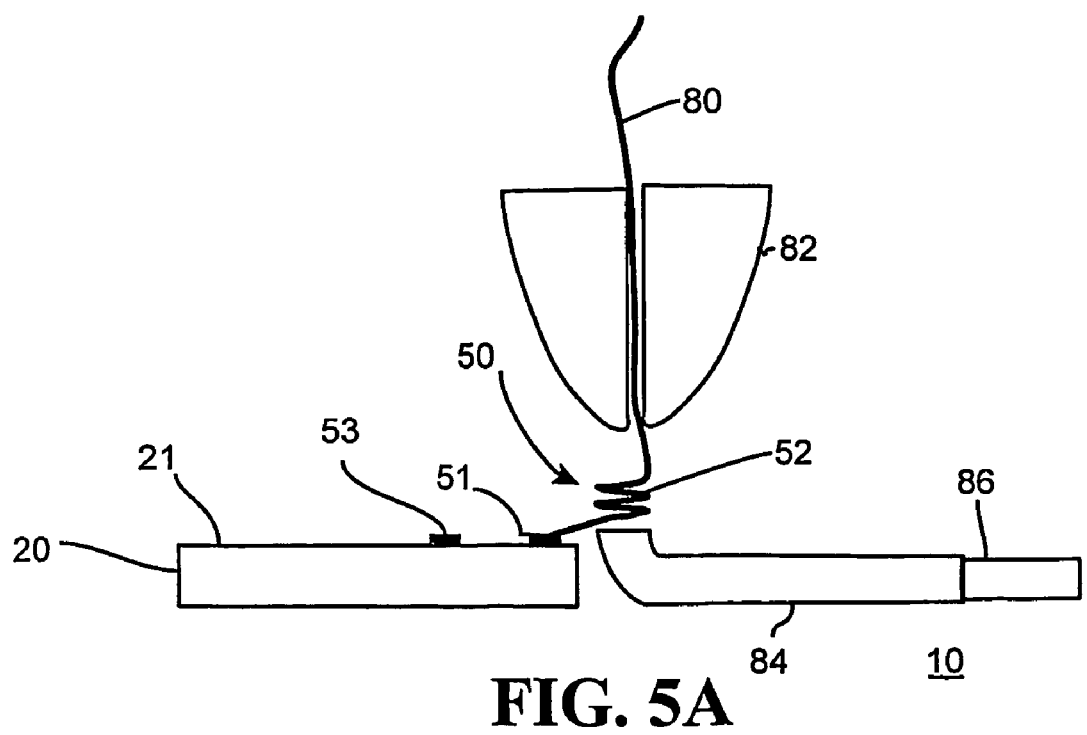
FIG. 5A is a side view of the semiconductor device after a second fabrication stage.

FIG. 5A shows a side view of integrated circuit 10 during a second stage in the fabrication of inductor 50. Capillary 82 clamps bonding wire 80 while shaper 86 is moved to its retracted position in tube 84, suspending coil 52 adjacent to semiconductor die 20 as shown. The low friction material used to form shaper 86 and tube 84 facilitates the retraction of shaper 86 without deforming or disturbing coil 52.

FIG. 5B is a side view of integrated circuit 10 during a third stage in the fabrication of inductor 50. While clamping bonding wire 80 to prevent further wire feeding, capillary 82 is moved in X-direction to pull coil 52 into a horizontal position that extends over semiconductor die 20. Bonding wire 80 is then attached to bonding pad 53 and severed to form inductor 50 as shown.

It can be seen that other embodiments of inductor 50 can be made in a similar fashion by attaching bonding wire to its first attachment point, winding it around shaper 86 to form coil 52 in a vertical direction and then pulling coil 52 into a horizontal position for bonding to its second attachment point.

FIG. 6 shows integrated circuit 10 at a selected manufacturing stage in an alternative method of forming inductor 50. Bonding wire 80 is heated and fed through threads 88 interior to capillary 82. The threads precondition bonding wire 80 to a spring-like shape so that as bonding wire 80 emerges from capillary 82 and cools, it has the desired shape of coil 52. Attachment then proceeds as previously described in conjunction with FIG. 5B. With this method, bonding wire 80 preferably is doped with beryllium or a similar material to provide a springlike metal "memory" that retains the threaded shape.

In summary, the present invention provides a structure and method of making a semiconductor device that includes one or more wire bond inductors housed in a semiconductor package along with a semiconductor die. The wire bond inductor is formed with a bonding wire attached to a top surface of a semiconductor die. The bonding wire is extended laterally a distance greater than a height of the bonding wire to define an insulating core of the inductor.

The inductor formed in accordance with the invention has a high quality factor and a high frequency response while providing a low profile semiconductor package. While several methods of fabricating coils have been disclosed, it should be appreciated that other methods can provide a similar wire bond inductor. For example, the inductor can be made by utilizing a precoiled bonding wire that is doped with a material to retain its metal "memory". The bonding wire is then fed through a wire bonding tool in such a way that it retains its shape during inductor formation. Hence, when a predetermined length of the precoiled bonding wire is fed through a capillary, the wire emerges from the capillary already having the shape of a coil.

What is claimed is:

1. A semiconductor device, comprising:
   a semiconductor die having first and second bonding pads formed on a major surface and further having first and second edges; and
   a first inductor including a first bonding wire attached at one end to the first bonding pad and at a second end to the second bonding pad, wherein the first inductor extends laterally a distance greater than a height of the bonding wire to define an insulating core, and wherein the first inductor projects laterally over the first edge at least at two locations.

2. The semiconductor device of claim 1, wherein the insulating core is centered along an axis substantially perpendicular to the major surface.

3. The semiconductor device of claim 1, further comprising:
   first and second leads in spaced relationship with the semiconductor die; and
   a second inductor including a second bonding wire attached at one end to the first lead and attached at a second end to the second lead.

4. The semiconductor device of claim 1, wherein the first bonding wire is formed with a coil chat surrounds the insulating core, and wherein the insulating core is substantially centered along an axis running parallel to the first edge.

5. The semiconductor device of claim 4, further comprising a second inductor including a second bonding wire attached at a first end to a third bonding pad on the semiconductor die and at a second end to a fourth bonding pad on the semiconductor die, wherein the second inductor extends laterally a distance greater than a height of the second bonding wire to define a second insulating core centered along an axis substantially perpendicular to the major surface.

6. The semiconductor device of claim 5, wherein the first bonding wire has an inductance greater than about five nanohenries.

7. The semiconductor device of claim 1, further comprising a semiconductor package for housing the semiconductor die and the first inductor.

8. The semiconductor device of claim 7, further comprising a second bonding wire attached between a third bonding pad of the semiconductor die and a lead of the semiconductor package.

9. The semiconductor device of claim 7, wherein the semiconductor package includes an encapsulant for providing the insulating core and for maintaining a position of the coil.

10. The semiconductor device of claim 1, wherein the first bonding ware provides an inductance and the semiconductor die includes an oscillator operating at a frequency determined by the inductance.

11. The semiconductor device of claim 10, wherein the frequency is greater than two gigahertz.

12. The semiconductor device of claim 1, wherein the bonding wire has a substantially circular cross-section.

13. A semiconductor device, comprising:
    a semiconductor die having a plurality of bonding pads on a major surface and an edge; and
    a first inductor comprising a first bonding wire formed in a coil around a dielectric core and having a first end coupled to a first bonding pad on the major surface and a second end coupled to a second bonding pad on the major surface, and wherein the first inductor projects over the edge a lateral distance greater than its height, and wherein the first inductor projects laterally over the edge at least at two locations.

14. The semiconductor device of claim 13, wherein the dielectric core is centered along an axis substantially perpendicular to the major surface.

15. The semiconductor device of claim 13, wherein the dielectric core is substantially centered along an axis running parallel to the edge.

16. The semiconductor device of claim 13, further comprising a semiconductor package for housing the semiconductor die and the bonding wire and having a lead that provides the surface for attaching the bonding wire.

17. The semiconductor device of claim 3, wherein the second inductor comprises a coil conductor.

18. The semiconductor device of claim 13, further comprising:
  first and second leads in spaced relationship with the semiconductor die, each coupled to the semiconductor die; and
  a second inductor including a second bonding wire attached at one end to the first lead and attached at a second end to the second lead.

* * * * *